United States Patent [19]
Liu et al.

[11] Patent Number: 6,140,682
[45] Date of Patent: Oct. 31, 2000

[54] SELF PROTECTED STACKED NMOS WITH NON-SILICIDED REGION TO PROTECT MIXED-VOLTAGE I/O PAD FROM ESD DAMAGE

[75] Inventors: Meng-Hwang Liu, Tainan; Chen-Shang Lai, Taichung; Tao-Cheng Lu, Kaohshing; Mam-Tsung Wang, Hsinchu, all of Taiwan

[73] Assignee: Macronix International Co., Ltd., Hsinchu, Taiwan

[21] Appl. No.: 09/350,480

[22] Filed: Jul. 9, 1999

[51] Int. Cl.[7] ........................................ H01L 23/62
[52] U.S. Cl. ........................ 257/355; 257/360; 257/546
[58] Field of Search ..................................... 257/173, 327, 257/355, 357, 360, 368, 377, 382, 546

[56] References Cited

U.S. PATENT DOCUMENTS

| | | | |
|---|---|---|---|
| 5,495,118 | 2/1996 | Kinoshita et al. | 257/355 |
| 5,545,909 | 8/1996 | Williams et al. | 257/355 |
| 5,631,793 | 5/1997 | Ker et al. | 361/56 |
| 5,672,896 | 9/1997 | Lee et al. | 257/360 |
| 5,679,971 | 10/1997 | Tamba et al. | 257/357 |
| 5,780,897 | 7/1998 | Krakauer | 257/368 |
| 5,847,429 | 12/1998 | Lien et al. | 257/355 |

OTHER PUBLICATIONS

Anderson, Warren R. and Krakauer, David B., "ESD Protection for Mixed Voltage I/O Using NMOS Transistors Stacked in a Cascode Configuration," EOS/ESD Symposium, 1998. pp. 54–62.

Hulett, Terrry V., "On Chip Protection of High Density NMOS Devices," Motorola Semiconductor Group, Austin, Texas, pp. 90–96.

Amerasekera, Ajith and Duvvury, Charvaka, *ESD in Silicon Integrated Circuits*, John Wiley & Sons, 1995, pp. 55–145.

Duvvury, C. et al., "A Summary of Most Effective Electrostatic Discharge Protection circuits for MOS Memories and their Observed Failure Modes," Texas Instruments Inc., Houston, Texas, pp. 181–184.

*Primary Examiner*—Donald L. Monin, Jr.
*Assistant Examiner*—Hoai Pham
*Attorney, Agent, or Firm*—Mark A. Haynes; Haynes & Beffel LLP

[57] ABSTRACT

A self-protected output driver for an integrated circuit utilizing cascode configured MOSFET transistors is formed in a single active region, allowing a smaller layout area without sacrificing performance. Furthermore, the driver is laid out according to a standard cell layout and is adaptable for a variety of output driving specifications according to the need of a particular implementation. A doped region having a first conductivity type is formed in the substrate. A plurality of sets of cascode connected transistors having channels in the doped region is included. Sets of cascode connected transistors in the plurality include a first diffusion region, a second diffusion region on a first side of and separated from the first diffusion region by a channel of a first transistor, a third diffusion region on a second side of and separated from the first diffusion region by a channel of the second transistor, a fourth diffusion region on a first side of and separated from the second diffusion region by a channel of a third transistor, a fifth diffusion region on a second side of and separated from the third diffusion region by a channel of a fourth transistor. Gate structures are formed over the channels of the first, second, third and fourth transistors. An interconnect structure couples the first diffusion region to the contact pad, the fourth and fifth diffusion regions to the second supply terminal, the gate structures of the first and second transistors to a first supply terminal, the gate structure of the third transistor to a selected one of the second supply terminal and a signal source, and the gate structure of the fourth transistor to a selected one of the signal source and the second supply terminal. The structure acts typically as a pull-down stage for an output driver on an integrated circuit. A pull-up transistor is included in the complete circuit. The diffusion regions between the first and third transistor and between the second and fourth transistor are formed without silicide.

17 Claims, 5 Drawing Sheets

6,140,682

SELF PROTECTED STACKED NMOS WITH NON-SILICIDED REGION TO PROTECT MIXED-VOLTAGE I/O PAD FROM ESD DAMAGE

BACKGROUND OF THE INVENTION

1. Field of the Invention

This invention relates generally to electrostatic discharge ("ESD") protection of integrated circuits and more specifically to the ESD protection for output drivers of mixed voltage integrated circuits.

2. Description of Related Art

A trend in integrated circuit technologies is to push the power supply voltage lower, such as from the standard 5 volt power supply to 3.3 volts and lower. Lower power supply voltages on integrated circuits lead to the design of input/output structures that are optimized for the lower supply voltages. However, many standard devices continue to rely on 5 volt power supplies. Thus, mixed voltage circuits are being implemented. In some cases, mixed voltage circuits are implemented which result in the application of 5 volt signals to integrated circuit input/output structures that are designed for lower voltages. Electrostatic discharge protection for the input/output structures must be designed to handle the mixed voltage condition.

In general, ESD protection for such mixed voltage interfaces has been based on MOSFET transistors in a cascode configuration. See Anderson, et al., "ESD Protection for Mixed-Voltage I/O Using NMOS Transistors Stacked in a Cascode Configuration," EOS/ESD SYMPOSIUM 1998-54, pp. 2A.1.1–2A.1.9. In this configuration, a first transistor has its drain connected to the pad and its gate connected to the power supply. The source of the first transistor is connected to the drain of the second transistor. The drain of the second transistor is connected to ground. In this way, when the pad is a higher voltage, such as five volts, the voltages across the terminals on the cascode connected transistors should not exceed 3.3 volts. Because the voltages which stress the cascode connected transistors are lower, the input/output structure is more reliable, and does not suffer significant hot-electron degradation.

In the Anderson, et al. paper, the use of a cascode configuration is taught for ESD protection. The ESD protection of Anderson, et al. is applied in parallel with circuits used to drive the output signals on the pads being protected. Both the transistors in the cascode configuration are laid out in one active region in order to reduce the trigger voltage for effective ESD protection. However, the driving circuit is laid out in a different active region in order to raise the ESD trigger voltage of the driver to a level larger than that of the protection circuit. While the scheme is suitable for ESD protection, it requires additional area on the integrated circuit for the multiple active regions.

U.S. Pat. No. 5,780,897 describes an alternative ESD protection clamp for mixed voltage I/O stages. In this alternative, cascode transistors are used for ESD protection clamps and output drivers are used for a single pad. However, the output drivers stage is placed in the region which receives the silicide process to improve the contacts made for signals being driven by the circuit. The ESD protection clamp is placed in a region which does not receive the silicide process because ESD performance of the clamp degrades severely in the silicide region. Thus, the problem of the larger layout area required by the Anderson et al. technology is not solved completely.

It is desirable to provide an ESD protected output driver for integrated circuits which is as small as possible. Further, it is desirable to provide such technology in a standard cell format which can be used for a wide variety of integrated circuits without substantial redesign.

SUMMARY OF THE INVENTION

The present invention provides a self-protected output driver for an integrated circuit utilizing cascode configured MOSFET transistors. The self-protected output driver is formed in a single active region, allowing a smaller layout area without sacrificing performance. Furthermore, in one aspect of the invention, the driver is laid out according to a standard cell layout and is adaptable for a variety of output driving specifications according to the need of a particular implementation.

According to the present invention, an ESD protected integrated circuit comprises substrate on which a contact pad is formed. A doped region having a first conductivity type is formed in the substrate. A plurality of sets of cascode connected transistors having channels in the doped region are included. Sets of cascode connected transistors in the plurality include a first diffusion region within the doped region having a second conductivity type, a second diffusion region in the doped region having the second conductivity type on a first side of and separated from the first diffusion region by a channel of a first transistor, a third diffusion region in the doped region having the second conductivity type on a second side of and separated from the first diffusion region by a channel of the second transistor, a fourth diffusion region in the doped region having a second conductivity type on a first side of and separated from the second diffusion region by a channel of a third transistor, a fifth diffusion region in the doped region having a second conductivity type on a second side of and separated from the third diffusion region by a channel of a fourth transistor. Gate structures are formed over the channels of the first, second, third and fourth transistors. An interconnect structure couples the first diffusion region to the contact pad, the fourth and fifth diffusion regions to the second supply terminal, the gate structures of the first and second transistors to a first supply terminal, the gate structure of the third transistor optionally to the second supply terminal or to a signal source on the integrated circuit, and the gate structure of the fourth transistor optionally to the signal source or to the second supply terminal. The structure typically acts as a pull down stage for an output driver on the integrated circuit. Thus, a pull up transistor would included in the complete circuit.

At least the shared diffusion regions between the cascode connected first and third transistors and between the cascode connected second and fourth transistors have no silicide structure. This allows reduced gate-to-gate spacing between the transistors, saving layout area, and providing flexibility in the design for setting the trigger voltage and holding voltage of the driver.

In a preferred embodiment, silicide contact regions are formed in the first, fourth and fifth diffusion regions in a "silicide blocked" manner that leaves space between the gate structures and the silicide. The un-silicided portions provide ballast resistance to insure uniform conduction of the transistor pairs during an ESD event. This comes at a cost in driving capability of the device. However, sufficient driving capability can be provided by the design of the driving transistors.

In the embodiment described above with five parallel diffusion regions, a four-transistor, self-protected I/O driver is provided. The second and fourth transistors are connected in a cascode configuration and provide the driving stage. ESD protection clamps are provided by the cascode configured first and third transistors that are not used for driving the pad, and by the second and fourth transistors which are used for driving the pad. The structure can be extended to any number of transistors in the single active region, by placing additional diffusion regions and gate structures in parallel. The gate structures of transistors corresponding to the third and fourth transistors can be connected either to the second supply terminal or to a signal source depending on the particular driving characteristics desired.

According to another embodiment, a standard ESD protected output driver is provided. The standard ESD protected output driver includes an extended number of cascode transistor fingers. The gate structures of the lower transistors in each finger are coupled to a interconnect option block, such as a mask option block, by which the designer is able to select the number of fingers to be used for output driving power for a given implementation. Those fingers selected for the output driving power are connected to the signal source on an integrated circuit, while those fingers that are not selected are connected to ground, or the appropriate polarity of the power supply terminal.

Thus, according to the present invention, an integrated circuit is provided which includes a plurality of standard ESD protected driver circuits and adaptable interconnect structures which allow use of the driver circuit in a design library for a wide variety integrated circuit implementations.

Other aspects and advantages of the present invention are shown by the figures, the detailed description in the claims which follow.

DETAILED DESCRIPTION

A detailed description of embodiments of the present invention is provided with reference to the figures.

Figure 1:
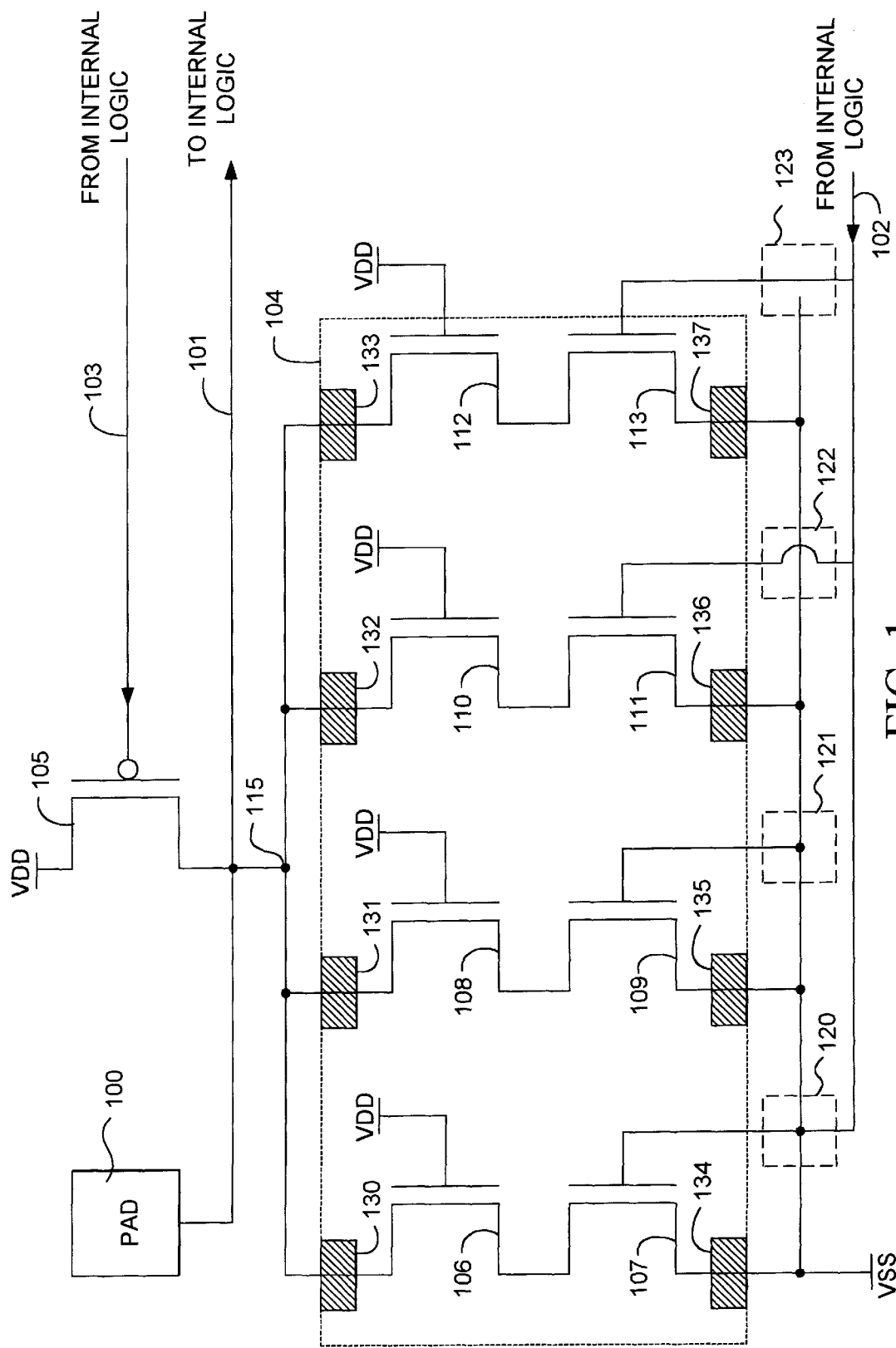
FIG. 1 depicts an electrostatic discharge protected output driver circuit coupled to the contact pad of a mixed voltage integrated circuit according to the present invention.

FIG. 1 is a simplified circuit diagram of a self-protected output driver having a standard layout according to the present invention. The output driver is coupled to an input/output pad 100. The pad 100 is connected on line 101 to internal logic or to other internal circuitry on the device, such as level detection circuits designed to process the input signal. Such circuitry is not described in this application. The driver receives a signal to be supplied to the pad 100 from internal logic, or from other signal sources, on lines 102 and 103 in this example. In the driver embodiment shown, the signals on lines 102 and 103 are true and complement versions of a signal to be applied to the pad 100. The signal on line 103 is applied to the gate of a pull up transistor 105, which in this embodiment is a p-channel MOSFET. The signal on line 102 is coupled to the pull down structure which includes a plurality of sets of cascode connected n-channel MOSFETs, all formed in the single active area of 104. In this example, there are four sets of cascode connected transistors, including a first set of transistors 106 and 107, a second set including transistors 108 and 109, the third set including transistors 110 and 111, and a fourth set including transistors 112 and 113.

The single active area 104 consists of a p-type diffusion region, in which the channels of n-type transistors 106–113 are found.

A top transistor in each set (transistors 106, 108, 110, 112) has a drain coupled to node 115. Node 115 is in turn coupled to the pad 100. The gates of top transistors are all connected to the positive power supply terminal VDD. The sources of the top transistors are coupled to a shared diffusion region, which includes the drains of the bottom transistors (transistors 107, 109, 111, 113). The sources of the bottom transistors are all coupled to the ground power supply terminal VSS.

The gate terminal of at least one of the bottom transistors is coupled to the signal on line 102. In this example, the gate of transistor 111 and gate of transistor 113 are connected to the signal on line 102. In this example, the gates of transistors 107 and 109 are connected to the ground power supply terminal VSS. In a standard cell embodiment, mask option blocks 120, 121, 122 and 123 are coupled between the gate terminals of the bottom transistors 107, 109, 111 and 113 respectively, and the ground power supply terminal VSS and the signal on line 102. Using mask option blocks, the designer is able to select the number of sets of cascode connected transistors to be used as the pull-down stage for the driver, and thereby set the driving power of the circuit. The sets that are not selected as pull-down transistors are used as backup protection clamps, which provide added ESD protection for the driver. The mask option blocks in one embodiment consist of a layout that provides for using a metal mask designed to connect the gate terminal of a transistor to the power supply line, or to the signal line 102 during the metallization process of manufacturing the chip. Other ways of providing for the selection of the connection can be used. For example, ROM cells can be used to connect or disconnect the gate terminals to particular lines. Field programmable structures might be utilized. In other examples, pass transistors or transmission gates having field programmable or manufacturing step programmable gate biases are used.

The use of silicide only on the drains of the top transistors and the sources of the bottom transistors is also illustrated schematically in FIG. 1. Thus, the silicide blocks 130, 131, 132 and 133 are shown in the diagram on the drains of transistors 106, 108, 110 and 112 respectively. The silicide blocks are spaced away from the gate terminals in the preferred embodiment. This spacing provides resistance on the path to the contact pad 100, and makes the ESD breakdown event more uniform across the structure. There is no silicide on the shared region which acts as the source of the top transistor and the drain of the bottom transistor in this self-protected driver circuit.

The preferred embodiment provides the mask option blocks, which provides a standard I/O cell in a cell library for semiconductor design. In the particular implementations, a dedicated connection layout can be utilized. Also, in the embodiment shown, ESD protection is provided using n-channel devices. P-channel devices are used in other embodiments of the invention, with appropriate signal polarity changes.

Figure 2:
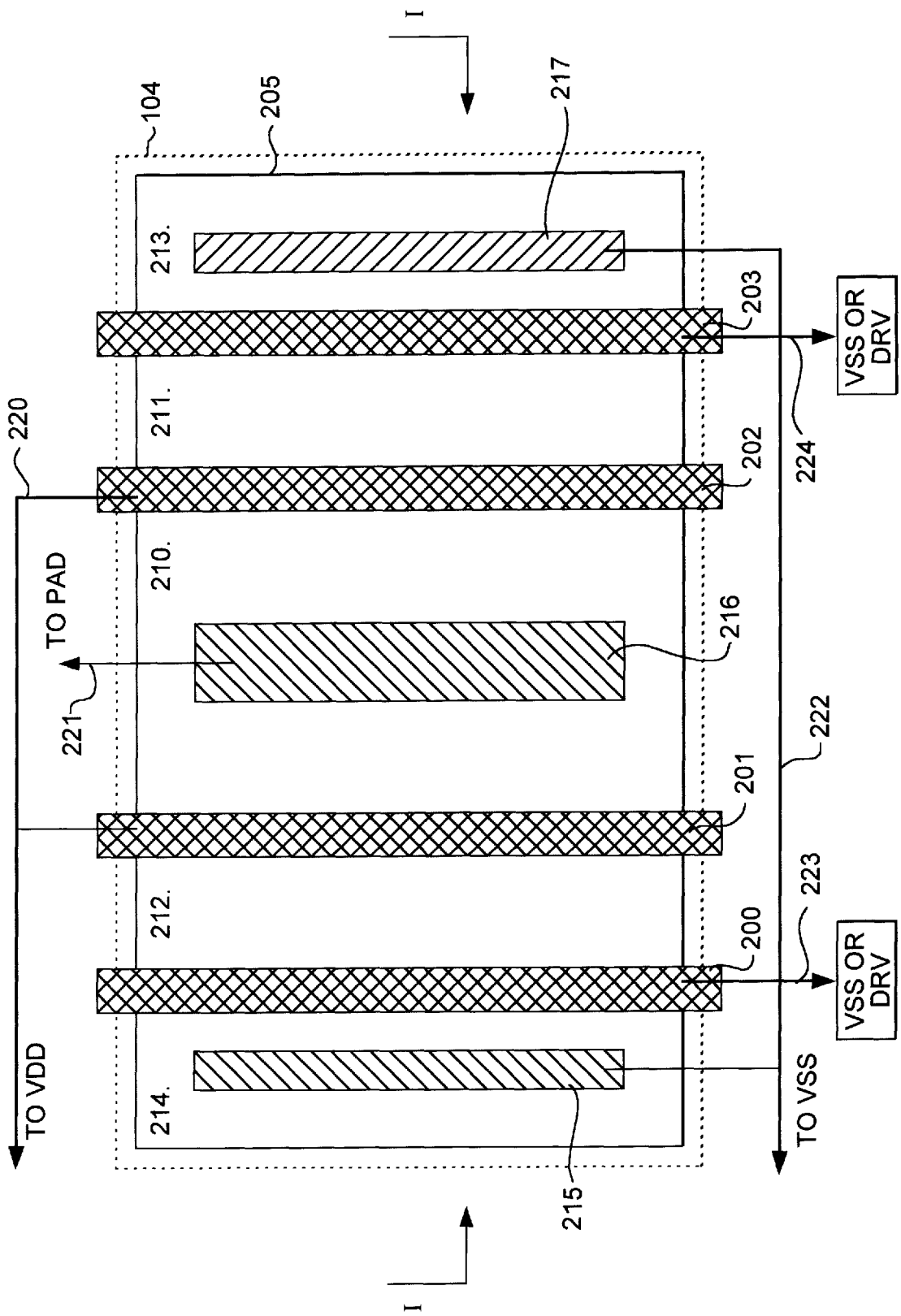
FIG. 2 is a top layout view of an ESD protected driver of the present invention.

FIG. 2 provides a plan view of the layout of the pull down structure for the standard output driver of the present invention using n-channel devices. Active region 104 consists of a p-type diffusion region in the semiconductor substrate. Gate structures, formed using polysilicon lines 200, 201, 202 and 203, are formed over a gate oxide layer (not shown) over the active region 104. N-type diffusion regions are formed using an implant process or otherwise within the active region 104, for example, within the perimeter defined by an implant mask having an edge 205, in a manner such that the gate structures 200, 201, 202 and 203 act as implant masks. This results in channels within the diffusion region 104 underneath the gate structures. Also, a first diffusion region 210 is formed between gate structures 201 and 202. A second diffusion region 211 is formed between gate structures 202 and 203, spaced away from the first diffusion region 210 by the channel region beneath gate structure 202. A third diffusion region 212 is formed between gate structures 201 and 200, spaced away from the first diffusion region 210 by the channel region beneath gate structure 201. A fourth diffusion region 213 is formed between the gate structure 203 and the edge of the implant mask 205. A fifth diffusion region 214 is formed between the gate structure 200 and the opposite edge of the implant mask 205.

A first transistor is established by the gate structure 202 and the diffusion regions 210 and 211. A second transistor is established by the gate structure 201 and the diffusion regions 210 and 212. A third transistor is established by the gate structure 203 and the diffusion regions 211 and 213. A fourth transistor is established by gate structure 200 and the diffusion regions 212 and 213. The transistors are manufactured using a "silicide blocked" technology to form silicide contact structures 215, 216 and 217 respectively, in the diffusion regions 210, 213 and 214, respectively. The silicide blocked technology in the diffusion regions 210, 213 and 214 results in the silicide contacts being spaced away from the gate structures, increasing the resistance of the contact, and improving the ESD protection performance. Also, the diffusion regions 212 and 211 have no silicide at all, reducing the layout requirements for the device.

FIG. 2 also illustrates the relative channel lengths and channel widths for the transistors in a preferred embodiment. In this embodiment, the channel length is about 1 micron or less. The channel width is on the order of 25 microns to 100 microns, or wider. The channel length and width parameters can be set to meet the driving and ESD protection characteristics of a particular embodiment.

Also shown schematically in FIG. 2 is the interconnect structure. The interconnect structure includes connection 220 which connects the gate structures 201 and 202 to the first power supply terminal VDD, connection 221 which connects the silicide contact 216 within diffusion region 210 to the pad 100, connection 222 which connects the silicide contacts 215 and 217 within the diffusion regions 214 and 213 to the second power supply terminal VSS, and the connections 223 and 224 which interconnect the gate structures 200 and 203 either to the second power supply terminal VSS or to the signal source for the driver, depending upon the layout selected as mentioned above with respect to FIG. 1.

Figure 3:
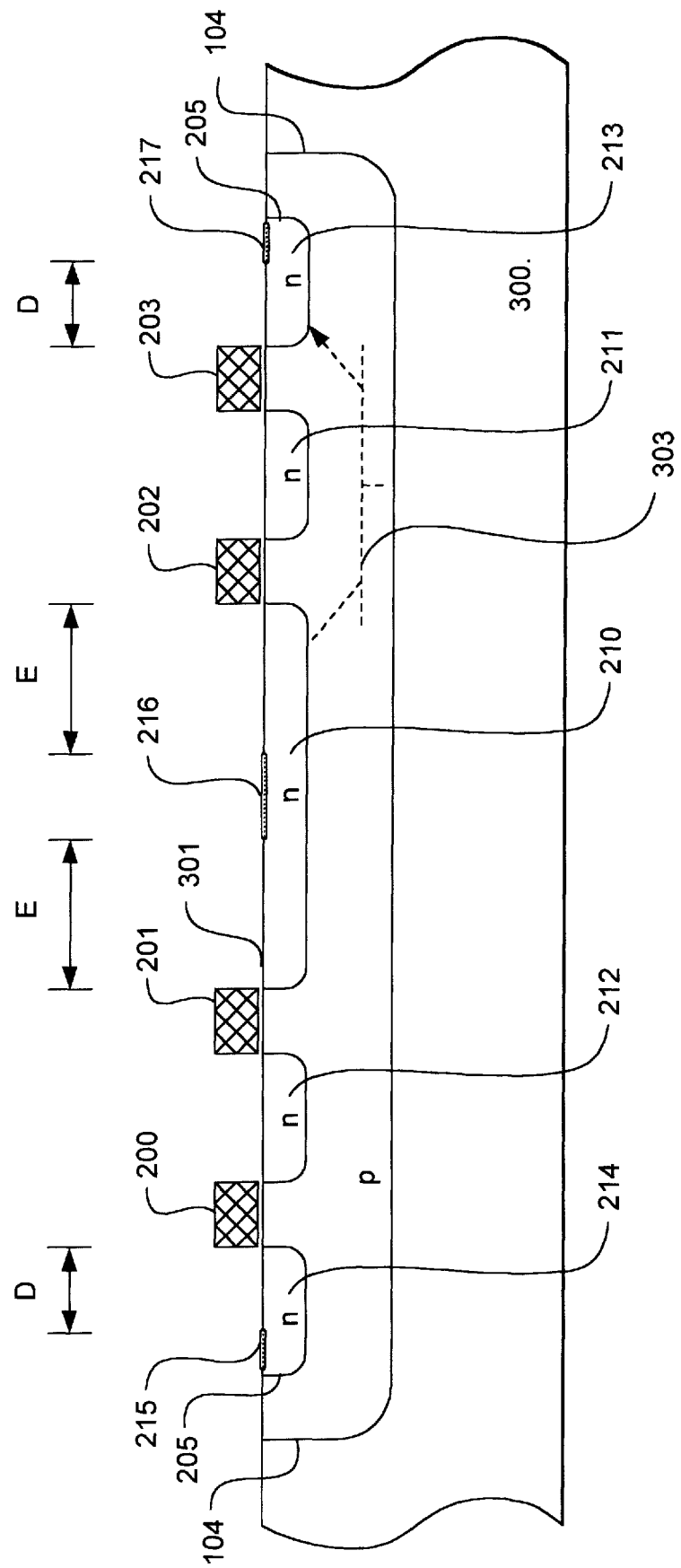
FIG. 3 is a cross-sectional view of the ESD protection device taken on line I—I of FIG. 2.

FIG. 3 is a cross-section taken along the line I—I of FIG. 2. The active region 104 and the edge 205 of the implant mask are labeled on both sides of the diagram. The active region 104 is a p-type region within the semiconductor substrate 300. Diffusion region 214, diffusion region 212, diffusion region 210, diffusion region 211, and diffusion region 213 are formed within the active region 104. Gate structures 200, 201, 202, and 203 overlie a gate oxide over the surface 301 of the substrate 300. Silicide region 215, silicide region 216, and silicide region 217 overlie the diffusion regions 214, 210 and 213 respectively. As is shown, using silicide blocked technology the silicide region 215 is spaced away from the gate structure 200 by a distance D. Likewise, the silicide region 217 spaced away from the gate structure 203 by a distance D. The silicide region 216 is spaced away from both gate structures 201 and 202 by a distance labeled E in the diagram.

The structure of FIG. 2 and FIG. 3 provides a four transistor self-protected ESD driver, which can be configured by the user to include two sets of cascode connected transistors as driver elements, or one set of cascode connected transistors as a driver element in combination with an ESD protection clamp consisting of the other set.

Each of the fingers of the self-protected driver includes a parasitic NPN transistor, such as the transistor 303 shown in FIG. 3, in which the diffusion region 210 is the collector, the shared diffusion region 104 is the base, and the diffusion region 213 is the emitter. During an ESD event, the contact pad 100, coupled to the diffusion region 210, is the source electrostatic energy. This electrostatic energy is discharged primarily through the parasitic NPN transistor 303, and through corresponding NPN transistors in other fingers of the device. The width of the diffusion region 211, and the corresponding spacing between the gate structures 202 and 203 controls the degree of resistance through the parasitic transistor 303, and accordingly the trigger voltage for the finger. An increase in the gate-to-gate spacing increases the resistance through the parasitic transistor and causes the trigger voltage to be increased. Because the diffusion region between the gate electrodes 202 and 203 is shared, and there is no silicide nor contact, the space between the gate electrodes 202 and 203 can be very small to provide embodiments with reduced trigger voltage.

Figure 4:
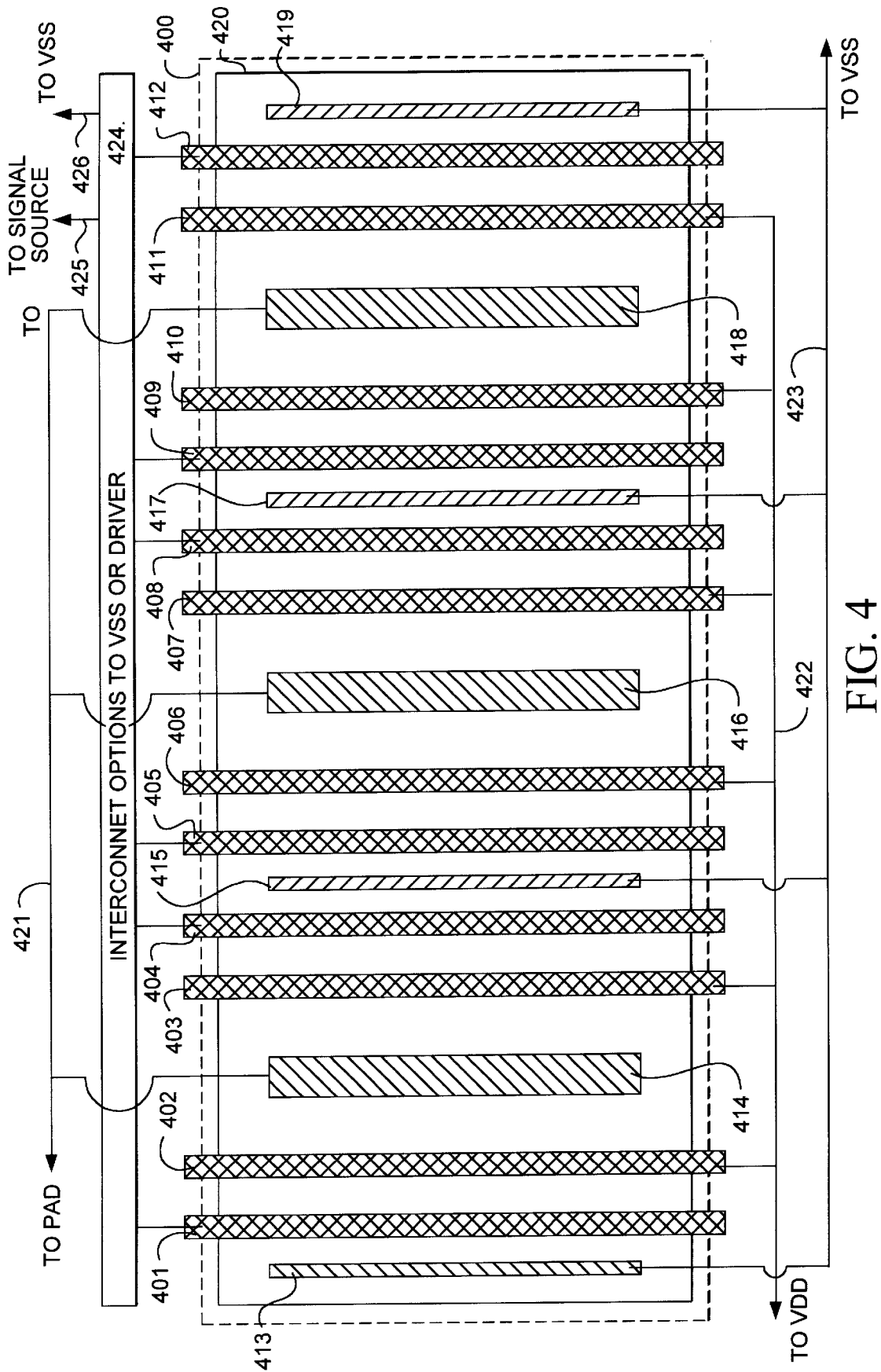
FIG. 4 illustrates a standard cell layout for an ESD protection device for an output driver according to the present invention

FIG. 4 illustrates a plan view of a pull down structure according to the present invention for a standard layout input/output cell. The cell is suitable for use in a design library, and can be adapted by the designer to meet the driving power needed for a particular output on an integrated circuit. The example shown in FIG. 4 includes six cascode connected transistor pairs including the transistors defined by the gate structures 401 and 402, the gate structures 403 and 404, the gate structures 405 and 406, the gate structures 407 and 408, the gate structures 409 and 410, and the gate structures 411 and 412. The pull-down structure is formed within a single active region 400, having an n-type diffusion mask 420 to define the diffusion regions between the gate structures as described above. Silicide contacts 413, 414, 415, 416, 417, 418 and 419 are formed within the diffusion regions that serve as contacts to the pad through interconnect 421, and the diffusion regions that serve as contacts to the ground power supply terminal VSS through interconnect 423. An interconnect 422 is coupled to the gate structures 402, 403, 406, 407, 410 and 411 and to the positive supply terminal VDD. The gate structures 401, 404, 405, 408, 409 and 412 are coupled to an interconnect option block 424 by which they may be connected either to the signal source for the driver on line 425 or to the ground supply terminal VSS on line 426.

While the cell layout of FIG. 4 shows six transistor pairs, the standard cell layout may be arranged to provide any number of pairs as suits the particular implementation. Also, the lengths and widths of the transistors can be designed as appropriate.

As is shown, using the interconnect options 424, the standard cell can be arranged to provide any number of fingers acting as pull-down stages for the driver. The overall ESD protection is established by the number of fingers in the standard layout while the driving power is established by the number of fingers connected to the signal source.

Figure 5:
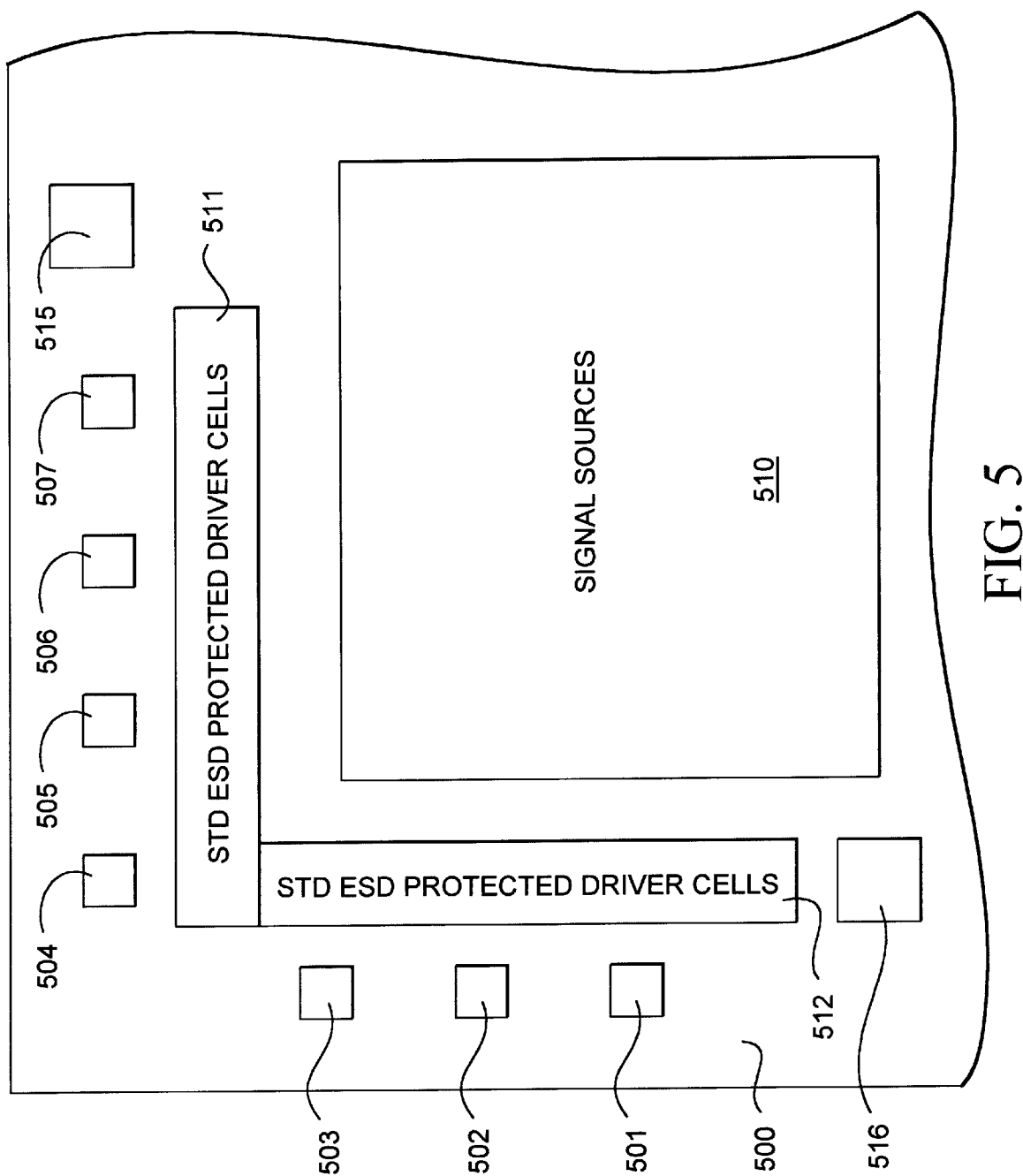
FIG. 5 shows an integrated circuit having a plurality of signal sources and standard cell ESD protected output drivers according to the present invention.

FIG. 5 is a simplified diagram of a corner of an integrated circuit 500 having output pads 501, 502, 503, 504, 505, 506, and 507. The interior of the integrated circuit includes signal sources 510 which are coupled to respective pads 501–507. Arranged adjacent to the pads are arrays of standard ESD protected driver cells 511 and 512. The standard cells are connected using metal mask options, or using other interconnect structures allowing optional connections, to meet the driving needs for the particular signal. Also illustrated schematically on the diagram are first and second power supply terminals 515 and 516, which are connected to the VSS and VDD terminals of external power supply.

While the present invention is disclosed by reference to the preferred embodiments and examples detailed above, it is to be understood that these examples are intended in an illustrative rather than limiting sense, as it is contemplated that modifications and combinations will readily occur to those skilled in the art, which modifications and combinations will be within the spirit of the invention and the scope of the appended claims.

What is claimed is:

1. An integrated circuit with a circuit acting as a signal source, and having ESD protected driver circuit for signal provided by the signal source, comprising:
   a substrate;
   a contact pad on the substrate;
   a doped region having a first conductivity type in the substrate;
   a plurality of sets of cascode connected transistors having channels in the doped region, sets of cascode connected transistors in the plurality of sets including:
      a first diffusion region in the doped region having a second conductivity type;
      a second diffusion region in the doped region having the second conductivity type, on a first side of and separated from the first diffusion region by a channel of a first transistor;
      a third diffusion region in the doped region having the second conductivity type, on a second side of and separated from the first diffusion region by a channel of a second transistor;
      a fourth diffusion region in the doped region having the second conductivity type on a first side of and separated from the second diffusion region by a channel of a third transistor; and
      a fifth diffusion region in the doped region having the second conductivity type on a second side of and separated from the third diffusion region by a channel of a fourth transistor;
      gate structures over the channels of the first, second, third and fourth transistors, and
      an interconnect structure coupling the first diffusion region to the contact pad, the fourth and fifth diffusion regions to the second supply terminal, the gate structures of the first and second transistors to the first supply terminal, the gate structure of the third transistor to a selected one of the second supply terminal and the signal source, and the gate structure of the fourth transistor to a selected one of the signal source and the second supply terminal.

2. The integrated circuit of claim 1, further comprising:
   a first silicide layer formed over a portion of the first diffusion region spaced away from the channel of the first and second transistors and coupled to the interconnect structure;
   a second silicide layer formed over a portion of the fourth diffusion region spaced away from the channel of the third transistor and coupled to the interconnect structure; and
   a third silicide layer formed over a portion of the fifth diffusion region spaced away from the channel of the third transistor and coupled to the interconnect structure.

3. The integrated circuit of claim 2, wherein there is no silicide layer on the second and third diffusion regions.

4. The integrated circuit of claim 1, wherein the interconnect structure includes a mask option block allowing connection of the gate structure of the third transistor to either the second supply terminal or to the signal source.

5. The integrated circuit of claim 1, including:
   a sixth diffusion region in the doped region having the second conductivity type, on a first side of and separated from the fourth diffusion region by a channel of a fifth transistor;
   a seventh diffusion region in the doped region having the second conductivity type, separated from the sixth diffusion region by a channel of a sixth transistor;
   an eighth diffusion region in the doped region having the second conductivity type separated from the seventh diffusion region by a channel of a seventh transistor;
   a ninth diffusion region in the doped region having the second conductivity type separated from the eighth diffusion region by a channel of an eighth transistor;
   gate structures over the channels of the fifth, sixth, seventh and eighth transistors; and
   an interconnect structure coupling the seventh diffusion region to the contact pad, and the ninth diffusion region to the second supply terminal, the gate structures of the sixth and seventh transistors to the first supply terminal, the gate structure of the fifth transistor to one of the signal source and the second supply terminal, and the gate structure of the eighth transistor to one of the signal source and the second supply terminal.

6. The integrated circuit of claim 1, wherein the interconnect structure includes mask option blocks coupled with the third, fourth, fifth and eighth transistors, allowing connection of the gate structures of the third, fourth, fifth and eighth transistors, respectively, to either the second supply terminal or the signal source.

7. The integrated circuit of claim 1, wherein the first, second, third, and fourth, transistors have channel widths greater than 10 microns, and channel lengths less than about 1 micron.

8. The integrated circuit of claim 1, wherein the first, second, third, and fourth, transistors have channel widths greater than about 25 microns, and channel lengths less than about 1 micron.

9. An integrated circuit having a plurality of signal sources, and having ESD protected driver circuits for signal provided by the signal source, comprising:
   a substrate;
   a plurality of contact pads on the substrate;
   a plurality of ESD protected driver circuits coupled to corresponding signal sources and contact pad in the plurality of contact pads, the ESD protected driver circuits including, respectively:
      a doped region having a first conductivity type in the substrate;

a plurality of sets of cascode connected transistors having channels in the doped region, the plurality of sets of cascode connected transistors in the plurality of sets including:
   a first diffusion region in the doped region having a second conductivity type;
   a second diffusion region in the doped region having the second conductivity type, on a first side of and separated from the first diffusion region by a channel of a first transistor;
   a third diffusion region in the doped region having the second conductivity type, on a second side of and separated from the first diffusion region by a channel of a second transistor;
   a fourth diffusion region in the doped region having the second conductivity type on a first side of and separated from the second diffusion region by a channel of a third transistor;
   a fifth diffusion region in the doped region having the second conductivity type on a second side of and separated from the third diffusion region by a channel of a fourth transistor;
   gate structures over the channels of the first, second, third and fourth transistors; and
   an interconnect structure coupling the first diffusion region to the contact pad, and the fourth and fifth diffusion regions to the second supply terminal, the gate structures of the first and second transistors to the first supply terminal, the gate structure of the third transistor to the second supply terminal and the gate structure of the fourth transistor to signal source, and an interconnect option structure allowing connection of the gate structure of the third transistor to either the second supply terminal or to the signal source.

10. The integrated circuit of claim 9, further comprising:
   a first silicide layer formed over a portion of the first diffusion region spaced away from the channel of the first and second transistors and coupled to the interconnect structure;
   a second silicide layer formed over a portion of the fourth diffusion region spaced away from the channel of the third transistor and coupled to the interconnect structure; and
   a third silicide layer formed over a portion of the fifth diffusion region spaced away from the channel of the fourth transistor and coupled to the interconnect structure.

11. The integrated circuit of claim 10, wherein there is no silicide layer on the second and third diffusion regions.

12. The integrated circuit of claim 9, wherein the ESD protected drivers include:
   a sixth diffusion region in the doped region having the second conductivity type, on a first side of and separated from the fourth diffusion region by a channel of a fifth transistor;
   a seventh diffusion region in the doped region having the second conductivity type, separated from the sixth diffusion region by a channel of a sixth transistor;
   an eighth diffusion region in the doped region having the second conductivity type separated from the seventh diffusion region by a channel of a seventh transistor; and
   a ninth diffusion region in the doped region having the second conductivity type separated from the eighth diffusion region by a channel of an eighth transistor;
   gate structures over the channels of the fifth, sixth, seventh and eighth transistors, and
   an interconnect structure coupling the seventh diffusion region to the contact pad, and the ninth diffusion region to the second supply terminal, the gate structures of the sixth and seventh transistors to the first supply terminal, the gate structure of the fifth transistor to one of the signal source and the second supply terminal, and the gate structure of the eighth transistor to one of the signal source and the second supply terminal, and includes a mask option block allowing connection of the respective gate structures of the at least one of the fifth and eighth transistors to either the second supply terminal or to the signal source.

13. The integrated circuit of claim 9, wherein the first, second, third, fourth, fifth, sixth, seventh and eighth transistors have channel widths greater than 10 microns, and channel lengths less than about 1 micron.

14. The integrated circuit of claim 9, wherein the first, second, third, fourth, fifth, sixth, seventh and eighth transistors have channel widths greater than about 25 microns, and channel lengths less than about 1 micron.

15. An integrated circuit having a plurality of signal sources, and having ESD protected driver circuits for signal provided by the signal source, comprising:
   a substrate;
   a plurality of contact pads on the substrate;
   a plurality of ESD protected driver circuits coupled to corresponding signal sources and contact pad in the plurality of contact pads, the ESD protected driver circuits including, respectively:
      a doped region having a first conductivity type in the substrate;
      a plurality of sets of cascode connected transistors having channels in the doped region, a given set of cascode connected transistors in the plurality of sets including a first MOS transistor having a drain, a source and a channel, and a second MOS transistor having a drain, a source and a channel; the gate of the first transistor in the set coupled to a first supply terminal, the source of the first MOS transistor and drain of the second MOS transistor coupled to a shared diffusion region within the doped region, the source of the second MOS transistor coupled to a second supply terminal, and the gate of the second MOS transistor coupled to a connection option block, arranged for connection to either the second supply terminal or to a signal source on the integrated circuit.

16. The integrated circuit of claim 15, wherein the shared diffusion region comprises a silicide blocked diffusion region.

17. The integrated circuit of claim 15, wherein there are at least four sets of cascode connected transistors in each ESD protected driver circuit.

* * * * *